United States Patent [19]

Lacher

[11] 4,009,437
[45] Feb. 22, 1977

[54] NET ANALYZER FOR ELECTRONIC CIRCUITS

[75] Inventor: William Arthur Lacher, Lansdale, Pa.

[73] Assignee: Burroughs Corporation, Detroit, Mich.

[22] Filed: Mar. 31, 1976

[21] Appl. No.: 672,426

[52] U.S. Cl. .................. 324/73 R; 235/153 AC
[51] Int. Cl.² ............................. G01R 15/12
[58] Field of Search .............. 324/73 AT, 73 R; 235/153 AC

[56] References Cited
UNITED STATES PATENTS

| | | | |
|---|---|---|---|
| 3,621,387 | 11/1971 | Smith | 324/73 R |
| 3,883,801 | 5/1975 | Hess | 324/73 R |
| 3,924,144 | 12/1975 | Hadamard | 324/73 R X |

*Primary Examiner*—Rudolph V. Rolinec
*Assistant Examiner*—Vincent J. Sunderdick
*Attorney, Agent, or Firm*—K. R. Peterson; Edward J. Feeney, Jr.; Francis A. Varallo

[57] ABSTRACT

The present disclosure describes a device for checking the dc characteristics of electronic nets disposed for example in assemblies utilized in data processing equipment. The operation of the analyzer assumes the presence of one or more controlled impedance nets, as may be achieved through the use of current mode logic configurations. The device which is employed while the circuit under test is in a power-off condition, first determines which type of net is being tested, passes a current of known magnitude through the net, and then compares the actual voltage developed thereacross with expected voltage values falling within a tolerance range. The voltage corresponding to the nominal impedance of the net and the tester current passed therethrough, lies at the center of the range. The analyzer automatically checks all the pins of a monolithic integrated circuit chip in sequence. If the nets associated with all the pins fall within the tolerance ranges, a "good" indication occurs upon test completion. On the other hand, if an out-of-tolerance net is encountered, the testing sequence is interrupted, an error indication is produced, and the pin associated with the "bad" net is identified by the analyzer.

16 Claims, 11 Drawing Figures

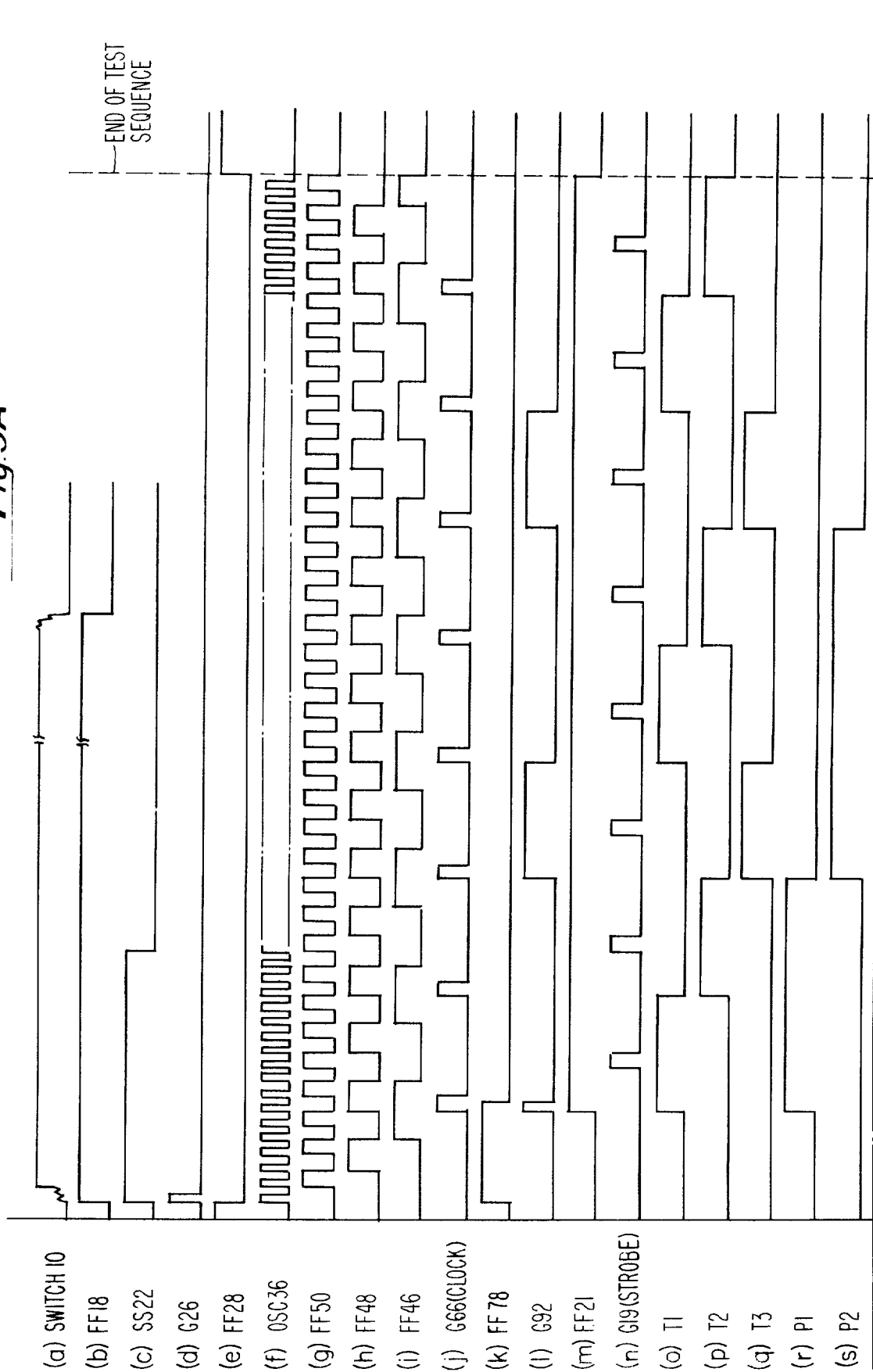

NET ANALYZER FOR ELECTRONIC CIRCUITS

CROSS REFERENCE TO RELATED APPLICATIONS

To the extent that the net analyzer of the present invention finds particular application in the testing of high density integrated circuits disposed on island assemblies as described and claimed in application Ser. No. 513,282, now U.S. Pat. No. 3,946,276, for "Island Assembly Employing Cooling Means for High Density Integrated Circuit Packaging" by Robert E. Braun et al, such application is referenced herein. Also pertinent is application Ser. No. 513,278 for "Integrated Circuit Package Connector with Probing Facility", by Robert E. Braun et al, now U.S. Pat. No. 3,955,867, which describes and claims a unique connector for facilitating electrical probing for test purposes. The probing fixture which is described in the application, interfaces with the connector and may be utilized in connection with the net analyzer of the present invention. Both applications are assigned to the same assignee as the present application.

BACKGROUND OF THE INVENTION

As noted in the referenced applications, electronic equipment, particularly modern data processing systems, use high density packaging of integrated circuits. The latter are installed in connectors which in turn are mounted on an interconnection board. The electrical contacts within the connector provide electrical circuit paths between the integrated circuit package leads and the conductive pads of the interconnection board.

In any electronic system, the need arises for checking the electrical integrity of the circuits even before they are energized to determine if they fall within prescribed design ranges. The results of such examination are used to pinpoint either present or future malfunctions of the equipment. In a high density packaging system of the type mentioned hereinbefore, the individual checking of the numerous integrated circuit pin connections becomes a complex and time consuming task. Continuity checks and impedance measurements are necessarily performed manually for each of the pins. The present invention obviates this difficulty by automatically checking all of the pins of an integrated circuit chip in sequence and determining whether or not the circuit nets associated with the pins are within established tolerances.

SUMMARY OF THE INVENTION

In performing its function, the net analyzer relies upon the use of logic circuits which provide that the entire assembly has a controlled impedance net. For example, in an actual operative system utilizing current mode logic, a net comprises a typical gate driving a plurality of other gates. The impedance of the net in this case is derived from the output circuit of the driving gate, since the inputs of the driven gates are all very high impedance. As another example, in the same system a driver/receiver circuit of the current mode logic type, creates another net. The impedance of this net is a function of the resistors at either end of the lines coupling the pair of driver/receiver modules to each other. Additionally, diodes are connected across the line resistors at the driver ends, and these clamp the voltage across the net to a substantially fixed value when an analyzer test current of predetermined magnitude flows therethrough.

The aforementioned operative system is assumed to be made up of the two nets described above. It should be understood that other systems may be made up of fewer or more nets and that the principles involved in the present analyzer will apply to these systems. In analyzing the dc characteristics of the two nets of the representative system, a determination is made by the analyzer as to whether or not a given net is open, shorted to another net, or shorted to the reference potential (ground).

In performing this function, the analyzer, which electronically sequences from pin-to-pin of the circuits under test, passes a current of preselected amplitude through the net associated with a given pin. The voltage developed across the net is compared to a reference potential and a determination is thereby made as to which of the two types of nets is being analyzed. This determination in turn establishes a voltage tolerance range especially selected for the net under test. The passage of a second precise current through the net results in a voltage drop thereacross which is compared to the values encompassed by the tolerance range. If the test voltage falls within the range, the net is adjudged to be good, and the analyzer, sequences to the next pin to start another test cycle. When all of the nets coupled to the analyzer have been examined, an indicator, such as a lighted lamp, signifies that all the nets tested were found to be within tolerance. On the other hand, an out-of-tolerance net stops the sequencing, causing an error indicator light to be turned on, and identifying the pin on which the error occurred by illuminating a second light associated with that pin.

DESCRIPTION OF THE PREFERRED EMBODIMENT

Before proceeding with a circuit description of the net analyzer, it is useful to consider the nature of the two nets referred to hereinbefore as comprising a representative system.

Figure 1A:
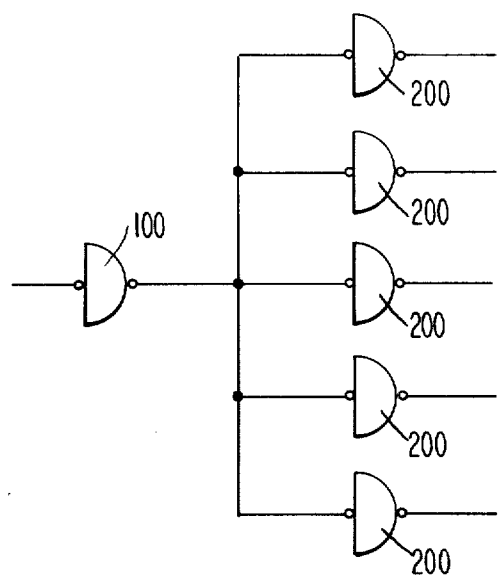
FIG. 1A is a logic drawing of a typical net found in an actual operative system.

In FIG. 1A, there is depicted a simple current mode logic diagram of a net in which one typical gate 100 is shown driving a group of five gates 200, which are the loads. More specifically, the net comprises the circuit paths from the output of the driving gate 100 to the common inputs of the receiving gates 200.

Figure 1B:
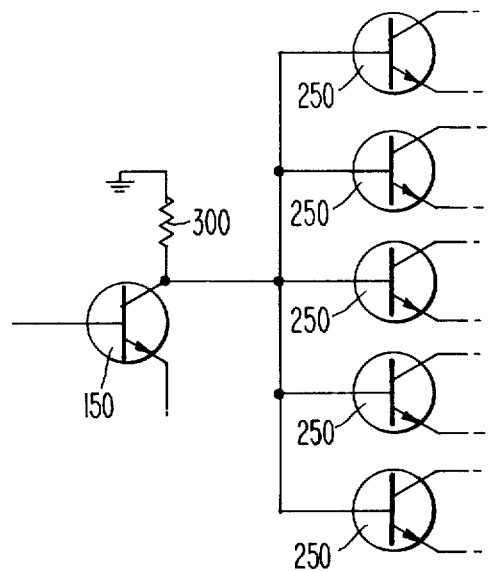
FIG. 1B is a simplified electrical schematic corresponding to the logic of FIG. 1A.

FIG. 1B, shows in highly simplified form, the circuit equivalent of the logic schematic of FIG. 1A. Transistor 150 represents the driving gate; transistors 250, the receiving gates. It should be noted that the impedance of the driving source is determined by the resistor 300 which couples the collector of transistor 150 to ground potential. Since the inputs to all of the receiving transistors are very high impedance, the impedance of the net is that of resistor 300. Impedance measurements, referenced to ground, made at any point on the net should equal the nominal resistance of resistor 300, plus or minus its resistance tolerance.

Figure 2A:
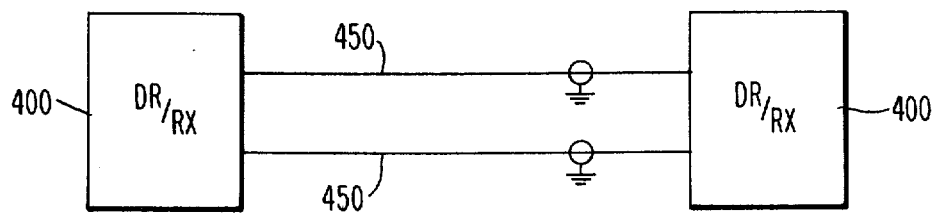
FIG. 2A is a functional diagram of another net utilized in the above mentioned system.
Figure 2B:
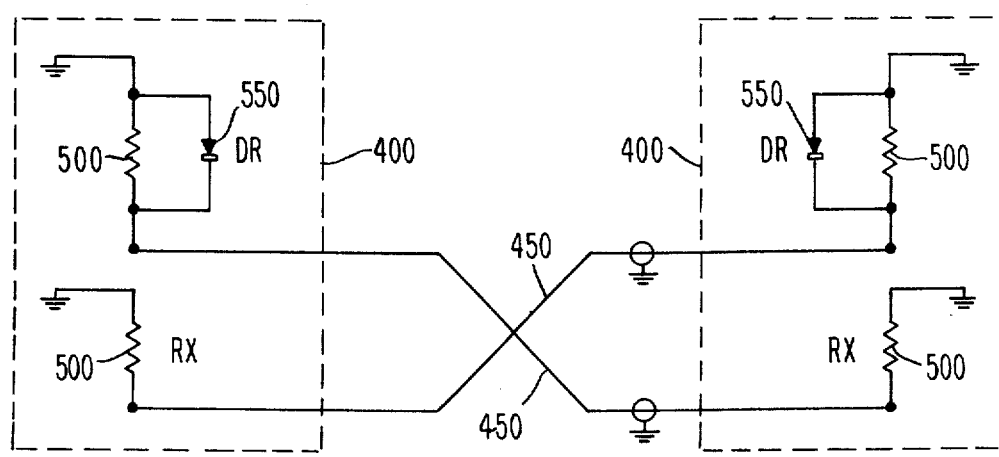
FIG. 2B is an electrical schematic corresponding to the diagram of FIG. 2A.

FIG. 2A depicts in functional form a second type of net which is encountered using current mode logic in generating a driver/receiver circuit. A pair of driver/receiver modules 400 are involved. These are coupled to each other by coaxial cables 450, and as seen in FIG. 2B, terminating resistors 500 are coupled to the conductors at both ends of the line. The net impedance is therefore the parallel combination of a pair of these resistors 500.

If it is assumed for purposes of example that the impedance of the net in FIGS. 1A and 1B is 40 ohms, the value of resistor 300, and that since the terminating resistors in FIGS. 2A and 2B are each 50 ohms, the impedance of the latter net is 25 ohms. Thus the two basic types of nets may be distinguished from each other by the substantial difference in their nominal impedance. There is another basic difference in the two nets which is employed to advantage by the analyzer. The driver/receiver net of FIGS. 2A and 2B incorporates silicon diodes 550 connected respectively in parallel across the line resistors of the driver stages. The effect of these diodes will be apparent in the description of the test cycle appearing hereinafter. For the present, it is enough to note that if the analyzer causes a current flow through the net under test, for example a 50 milliampere current, the voltage drop will be approximately 2 volts if the net is of the 40 ohm variety, but only 0.7 or 0.8 volts if it is of the 25 ohm type due to the clamping action of the diodes. These significantly different voltage drops are used by the analyzer to establish the type of net connected to the circuit pin under test.

Figure 3:
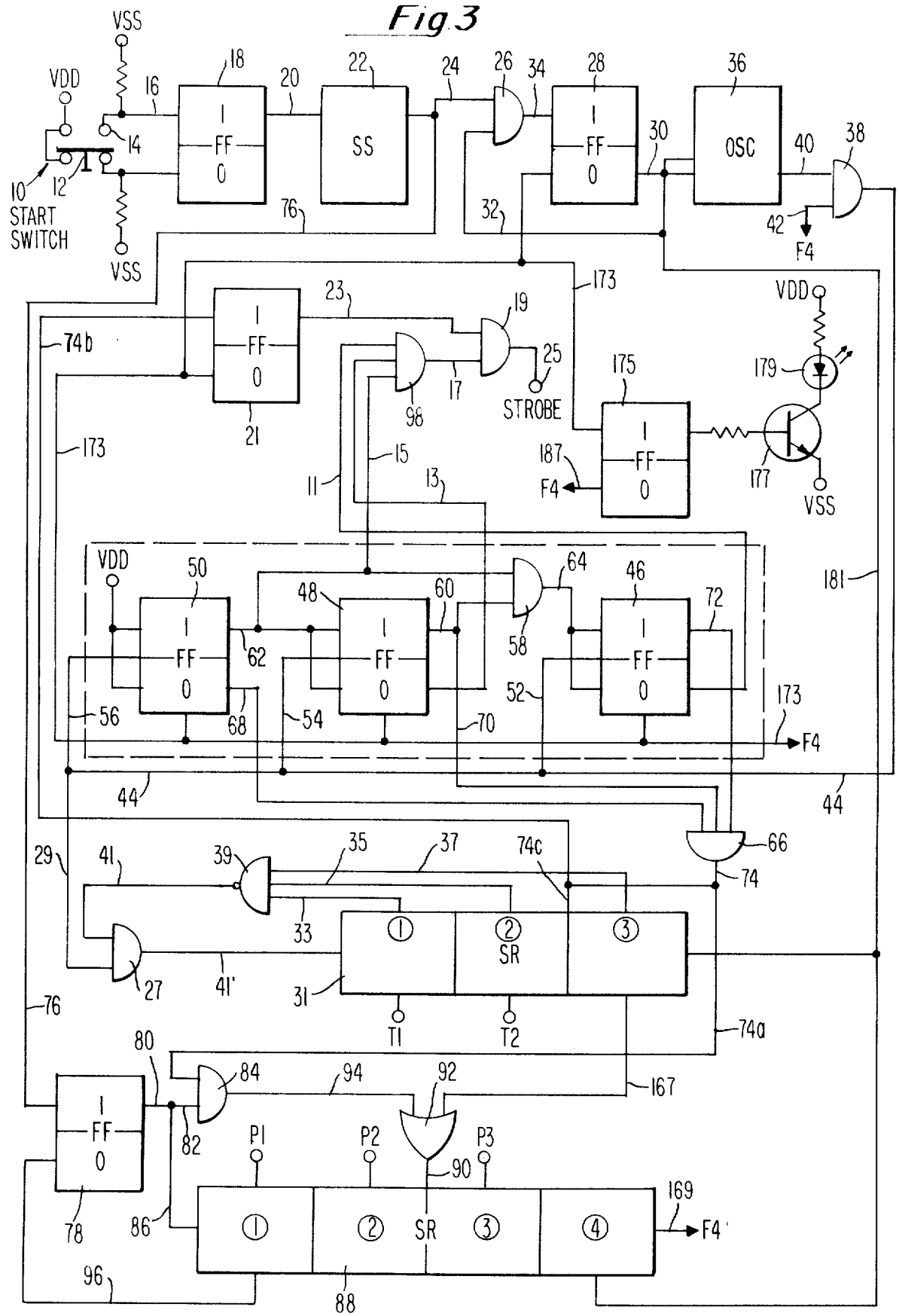
FIG. 3 is a logical schematic of the timing generator portion of the net analyzer.

With reference to FIG. 3, the timing generator portion of the analyzer and FIG. 5 the timing diagrams, the operation of the device will be described. For ease of explanation, the analyzer depicted in the drawing is designed to sequentially test three signal pins. It will be apparent however, that the test cycle is repetitive for each of the pins. In practice, an integrated circuit package having about fifty pins is tested in much the same manner as the three pin package. Any limitation on the number of pins capable of being checked lies not in the analyzer, but in the packaging of the circuit itself.

Mention should also be made before proceeding with the description of operation that an operative embodiment of the net analyzer was constructed using CMOS logic. This was done because the characteristics of such logic lend themselves to the intermittent operation of the device. The test cycle is completed in a very short time and the only significant power expended by the CMOS circuits occurs at that time. During standby, CMOS circuits draw only minute amounts of leakage current and the analyzer dissipates power on the order of one milliwatt. The analyzer requires no cooling and in fact may be built in a very compact manner. It should be emphasized that the foregoing construction details are provided solely for purposes of example, and should not be considered limitative of the invention. For example, other types of logic such as ECL, TTL or IIL may be used in the analyzer if desired.

Figure 5B:
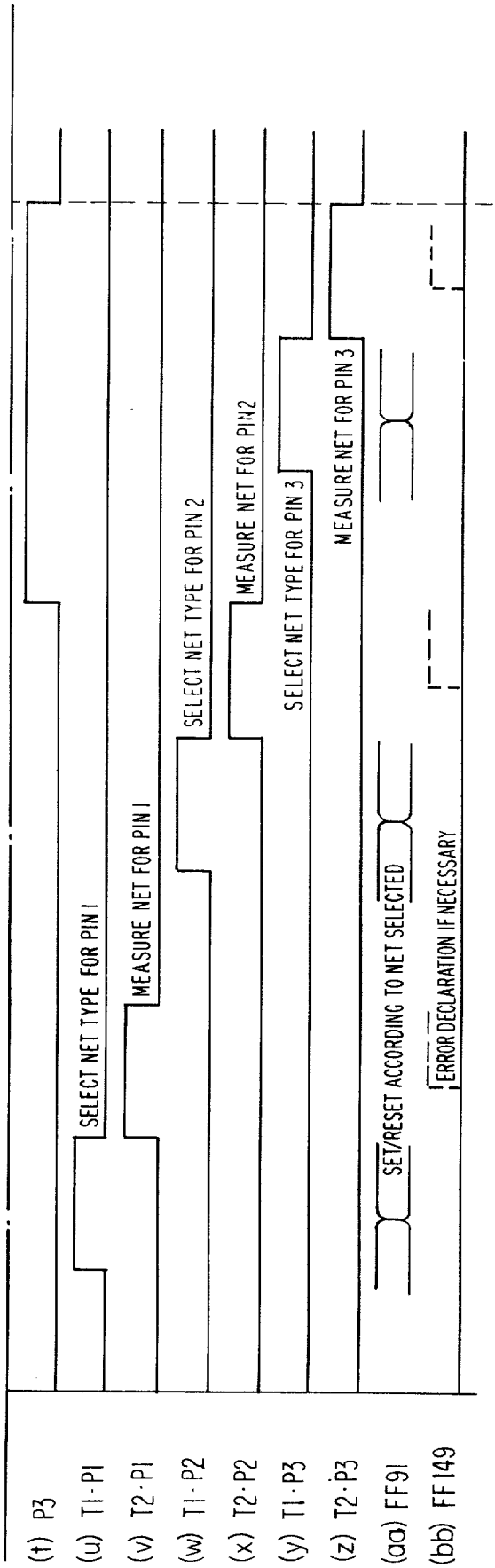
FIG. 5 comprises FIG. 5A and FIG. 5B which taken together constitute a timing diagram for an analyzer test sequence.
Figure 5:
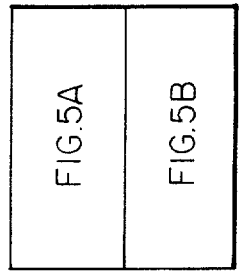

With reference to FIGS. 3 and 5, it is assumed that the circuit package to be tested is in a power-off condition, that the analyzer has been connected to all of the package pins or terminals, such as through the use of the probing fixture described in the referenced Ser. No. 513,278, Braun et al application, and that power has been applied to the analyzer itself.

In order to initiate the test cycle the RESET SWITCH 183 (FIG. 4) is momentarily depressed to insure that all the active analyzer components are placed in a reset state. The details of this reset function are contained hereinafter. Next, the momentary contact start switch 10 of FIG. 3 is actuated by moving switch arm 12 into contact with terminal 14, causing a positive going voltage level to be applied via line 16 to flip-flop (FF) 18. This level is depicted in FIG. 5a, and shows the initial transients or bounce upon switch closure. $V_{DD}$ and $V_{SS}$, the supply voltages are ground potential and $-10$ volts, respectively. Flip-flop 18 is triggered to its "1" state as seen in FIG. 5b, functions to eliminate the switch bounce effects which might otherwise adversely affect the circuit logic. The switching of flip-flop 18 applies a pulse via line 20 to trigger single-shot (SS) 22.

The output of single shot 22 on line 24 as seen in FIG. 5c is applied to one of the inputs of AND gate 26. Since flip-flop 28 is assumed to be initially in a reset condition, "O" state, as a result of the preceeding test cycle, line 30 is "high" and the other input to AND gate on line 32 is also "high". Therefore AND gate 26 is enabled, and produces an output on line 34 as seen in FIG. 5d. Flip-flop 28 is switched to the "1" state, causing lines 30 and 32 to go "low" and immediately terminating the output from gate 26. The negative going level on line 30 (FIG. 5e) which is the input to oscillator (OSC) 36, triggers the oscillator to generate the square wave pulses depicted in FIG. 5f. These output square waves are applied to AND gate 38 via line 40. The other input to gate 38, that is line 42, is assumed to be "high" at this time. As will be explained in detail hereinafter, the latter line is coupled to an error indicator circuit in FIG. 4 as implied by the designation "F4", which acts to interrupt the test cycle by disabling gate 38 when an error is encountered.

The square waves from oscillator 36 appearing at the output of gate 38 are applied via line 44 in common to three JK-type flip-flops 46, 48 and 50 by way of their respective input lines 52, 54 and 56. Flip-flops 46, 48 and 50 together with AND gate 58 comprise a three stage binary counter. Thus, the output level on line 60 of flip-flop 48, and line 62 of flip-flop 50 are applied to gate 58, which when both of the last mentioned lines are "high" generates an output on line 64. The latter output is applied to flip-flop 46. AND gate 66 serves to decode the counter. Gate 66 receives three inputs on lines 68, 70 and 72 from flip-flops 50, 48 and 46 respectively. The output levels of flip-flop 50, 48 and 46 as they appear on lines 62, 60 and 72 are shown in FIGS. 5g, 5h and 5i respectively. The pulse output on line 74 of gate 66 when all three inputs are "high" serves as a clock pulse for the analyzer system, as seen in FIG. 5j.

The clock pulse from gate 66 performs several functions. First, consider the initial triggering of single shot 22. The output of the latter appearing on line 76 is applied to flip-flop 78 switching it to the "1" state and causing its output on line 80 to become "high". This is shown in FIG. 5k. Line 80 branches into an input line 82 to AND gate 84 and line 86 into the first stage of pin shift register 88. The signal ("1") on this last line cannot be entered into the shift register 88 unless an enabling pulse is applied to the register via line 90, the output of OR gate 92. The presence of a "high" on line 82 at the input to gate 84, coupled with the first clock pulse "high" on its other input (line 74a), causes the output line 94 of gate 84 to go "high". This in turn causes an output from OR gate 92 and a "1" is entered into the first stage of the pin shift register 88. This action causes an output from the register on line 96 which is applied to flip-flop 78, causing it to return to its "0" state, and thereby disabling gate 84. The output of OR gate 92 which reads a "1" into the first stage of register 88 is depicted as the initial narrow pulse in FIG. 5l. Gate 84 remains ineffective until the start of the next complete test sequence, that is, until the start switch is again actuated. Terminal P1, the output from the first stage of shift register 88 is associated with the testing of pin number 1 the level being "high", as seen in FIG. 5r. The utility of this last output will become apparent in the description which follows hereinafter.

The clock pulse output from gate 66 also controls the start of the strobe pulses. The latter are generated in connection with flip-flops 46, 48 and 50 and AND gate 98. Outputs from flip-flops 46, 48 and 50 on lines 11, 13 and 15 respectively are applied to gate 98. The pulse output from gate 98 when all three inputs are "high" is applied via line 17 to another AND gate 19. This gate 19 requires an additional input from flip-flop 21 in order to become enabled. The initial clock pulse from gate 66 is applied by way of line 74b to flip-flop 21, placing it in the "1" state and making line 23 "high" as seen in FIG. 5m. Thus, gate 19 is enabled, and strobe pulses are available on output terminal 25 thereof. The strobe pulses are shown in FIG. 5m.

Besides the application of the square wave pulses from gate 38 to the counter flip-flops 46, 48 and 50, the first square wave pulse on line 44 at the output of gate 38, is also applied to AND gate 27 via input line 29. Since, at the start of the sequence, there is no information in the timing shift register 31, the output lines 33, 35 and 37 from its three respective stages are all "low". The output from NAND gate 39 on line 41 is therefore "high", and gate 27 is enabled making its output line 41' "high". A clock pulse on line 74c enables the entry of a "1" into the first stage of the timing shift register 31. The T1 terminal of shift register 31 also goes "high" as seen in FIG. 5o. The significance of this will be more apparent in the consideration of the switching portion of the analyzer as seen in FIG. 4.

Summarizing the circuit conditions just described as they relate to the timing shift register 31 and the pin shift register 88, the T1 and P1 terminals are both "high", as seen in FIGS. 5o and 5r and expressed logically in 5u. During the T1 time period, a determination is made by the analyzed as to the type of net coupled to the pin under test - in this case P1, pin number 1. This determination is accomplished by the switching networks of FIG. 4 in the following manner.

Figures 4, 4A:
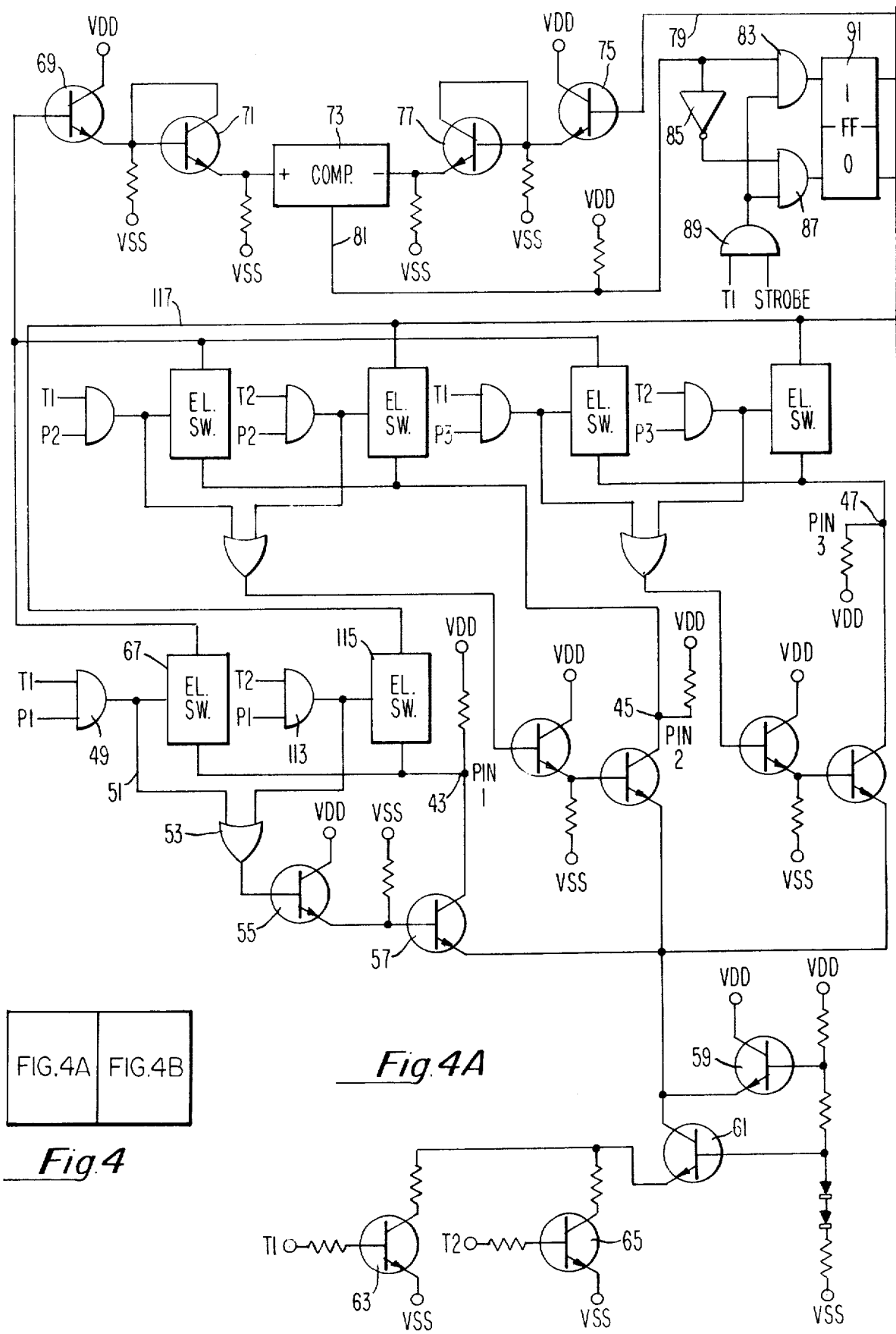
FIG. 4 comprises FIG. 4A and FIG. 4B which together provide a schematic of the switching networks of the analyzer.
Figure 4B:
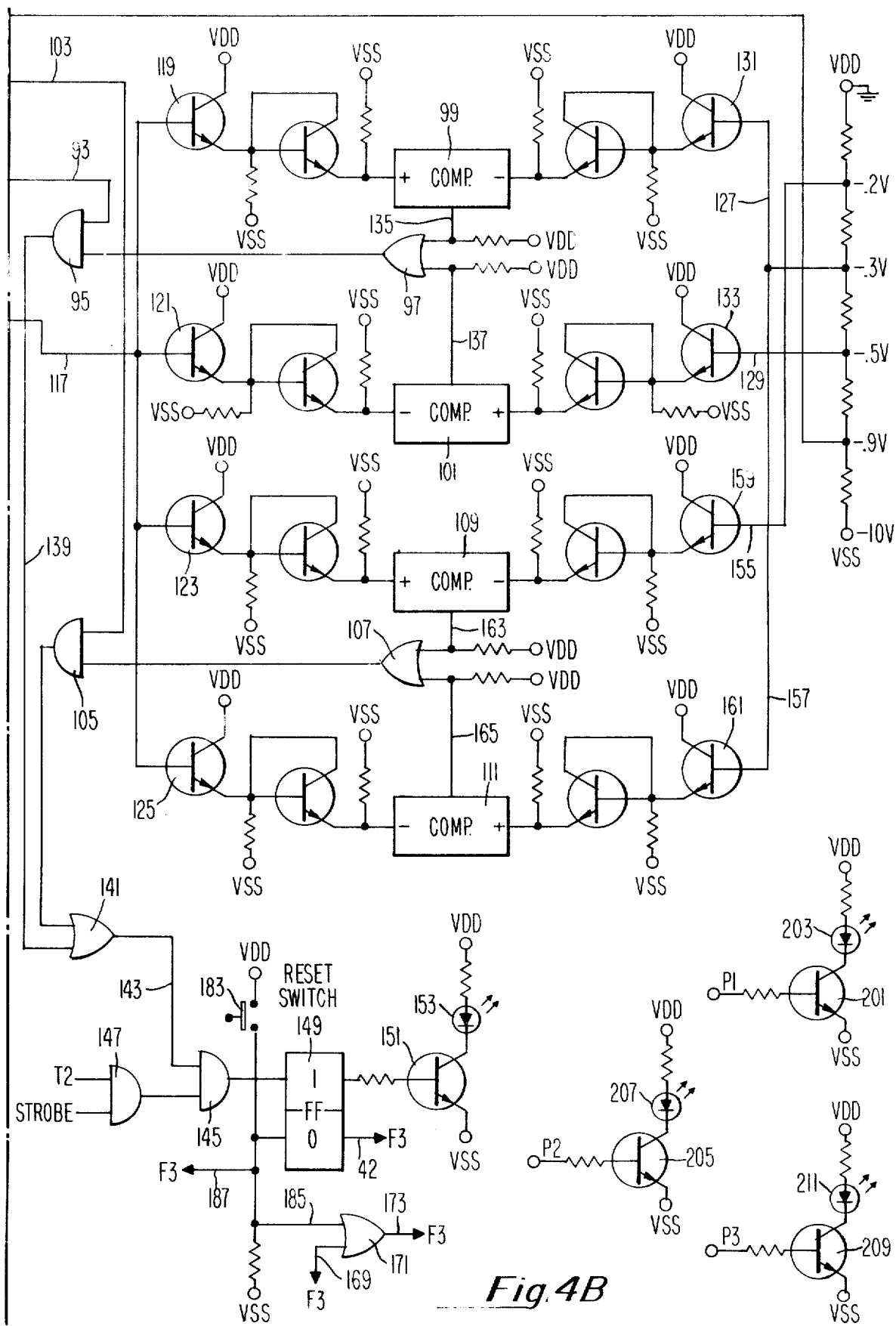

The networks depicted in FIG. 4 are coupled to the pins under test. For example, pin number 1 pin number 2 and pin number 3 are connected respectively to terminals 43, 45 and 47. The T1 and P1 signals from the timing and pin shift registers 31 and 88 respectively are applied to AND gate 49, which is enabled thereby. The output of gate 49 is applied via line 51 and OR gate 53 to the base electrode of transistor 55 connected as an emitter follower. Transistor 55 drives transistor 57 which along with transistor 59 forms a differential pair. Transistor 61 serves as a constant current source. Transistor 63 is in a conducting state due to the application of a T1 pulse to its base electrode. The impedance of this last stage is such that a predetermined current, of the order of 50 milliamperes in the present example, is made to flow through the net impedance coupled to pin number 1. Note that transistor 65 which conducts during time T2, the measurement portion of the test cycle, is OFF at this time, since its base electrode is connected to the T2 terminal of shift-register 31 (FIG. 3) and the latter is "low" at this time, as seen in FIG. 5p.

Now the output of AND gate 49 is also applied to an electronic analog switch 67 which is equivalent to a single pole, single throw switch. The switch 67 coupled pin number 1 (terminal 43) to the base electrode of transistor 69, which together with transistor 71 form an input stage to one side of comparator 73. Two other transistors 75 and 77 form the input stage to the other side of comparator 73. Thus, the base electrode of transistor 75 is coupled to a reference potential via line 79, in this case of the order of 0.9 volts derived from a voltage divider connected between $V_{DD}$ (ground potential) and $V_{SS}$ (−10 volts). It is interesting to note that in the operative embodiment under consideration, the transistors 69, 71, 75 and 77 are all contained in the same integrated circuit package. Thus their electrical characteristics track one another. Each pair of transistors functions as if it were a 1.7 or 1.8 Zener diode. Even if variations occur in the power supply voltage $V_{SS}$, both input stages to comparator 73 track each other, producing no harmful effects. Additionally, the two diode drops provided in each input stage assure that the input levels are higher than would be the case if they were not present. The comparator 73 requires such high levels to function properly.

Returning now to the determination of the type of net associated with pin number 1, it should be recalled that in the present example, only two nets are involved - one is approximately 40 ohms (FIGS. 1A, 1B), the other 25 ohms shunted by a diode (FIGS. 2A, 2B). The passage of the 50 milliampere current through the net under test will yield either a −2 volt level on the input electrode of transistor 69 from the former net; and a −0.7 or −0.8 volts, if it is the latter net.

Initially, it will be assumed that the voltage on pin number 1 is −2 volts, signifying a 40 ohm net. This voltage applied via switch 67 to the base electrode of transistor 69 is compared with the −0.9 volt reference potential applied to the base of transistor 75. The −2 volt and −0.9 volt levels, after level shifts as explained earlier, are applied respectively to the + and − terminals of comparator 73. Under these conditions, the output of comparator 73 on line 81 is "low" and this output level is applied to one terminal of AND gate 83, and to inverter 85. The output of inverter 85 is a "high" signal, and this is applied to one input of AND gate 87. AND gate 89 has two inputs — one input is derived from the T1 terminal of the timing shift register, while the other is connected to the STROBE output terminal 25 of gate 19 (FIG. 3). Since T1 is "high" at this time (FIG. 5o), the occurrence of a STROBE pulse (FIG. 5m), enables gate 89, which in turn applies a "high" to the respective "other" terminals of gates 83 and 87. Since, it has been noted that one input of gate 87 is already "high", the output of gate 89 enables gate 87, causing an output therefrom which places flip-flop 91 in the "0" state. The switching of flip-flop 91 to either the "1" or "0" states at strobe time, depending upon the net type, is illustrated in FIG. 5aa. Thus, line 93 connected to the "0" side of flip-flop 91 goes "high", making one of the inputs to AND gate 95 "high". It will be noted that the other input to AND gate 95 is derived via OR gate 97 from comparators 99 and 101. It is these comparators, utilized as a pair, to achieve a tolerance "window", that are provided with suitable reference levels to perform the measurement analysis of the 40 ohm net of FIGS. 1A and 1B. Each of these comparators has two pairs of transistors, used as input level shifters, as described in connection with comparator 73.

If the net coupled to pin number 1 had been a driver/receiver net of 25 ohms impedance shunted by a diode (FIGS. 2A and 2B), then approximately −0.7 volts would have been applied to transistor 69 and comparator 73 would have generated a "high" on output line 81. Gate 83 would have been enabled at strobe time, and flip-flop 91 would have been placed in the "1" state. The "1" output line 103 from flip-flop 91 would likewise be "high" as would one input of AND gate 105. The other input to the latter gate is derived from OR gate 107 which receives signals from comparators 109 and 111. These comparators receive suitable reference levels, to provide a tolerance window suitable for measurement of the 25 ohm net.

The measurement of the net under test, takes place at time T2. With reference to FIGS. 3 and 4, the next clock pulse out of gate 66, moves the "1" which had been placed in shift register 31 by the preceding clock pulse, from the first stage to the second stage thereof. The T1 terminal of shift register "low"; the T2 terminal, "high". This is illustrated in FIGS. 5o and 5p.

With reference to FIG. 4, transistor 63 is turned OFF; transistor 65 ON. A precise 10 milliampere current is caused to flow through the net under test. The "high" T2 and P1 signals (as seen individually in FIGS. 5p and 5r and indicated logically in 5v) applied to AND gate 113, enable the gate and cause switch 115 to connect pin number 1 (terminal 43) in common via line 117 to the input stage transistors 119, 121, 123 and 125 of the respective comparators 99, 101, 109 and 111. If the net is a 40 ohm type, the voltages on each of the aforementioned input stages is −0.4 volts. Only the comparators 99 and 101 are effective, since one input of their associated AND gate 95 is "high" as a result of the "0" state of flip-flop 91. Comparator 101 has its input terminals reversed in polarity from those of comparator 99. Considering comparators 99 and 101, if the pin number 1 voltage lies between −0.3 volts and −0.5 volts, the respective reference voltages of such comparators appearing on lines 127 and 129 and applied to the bases of transistors 131 and 133, the outputs of both appearing on lines 135 and 137 are "low". If the voltage on pin number 1 is less than −0.3 volts, the comparator 99 output on line 135 will be "high". Also, if the pin voltage is greater than −0.5 volts, the comparator 101 output on line 137 will be "high". In either of these events, the net is out-of-tolerance and an error indication will be generated. Gate 95 is enabled, and an output therefrom on line 139, is coupled via OR gate 141 and line 143 to one of the inputs to AND gate 145. AND gate 147 is enabled by the STROBE and T2 signals and its output in turn enables gate 145. Flip-flop 149 is placed in the "1" state as indicated in FIG. 5bb, turning on transistor 151 and lighting the error indicator LED 153. At the same time, switching flip-flop 149 from the "0" to the "1" state, disables the square wave output gate 38 via line 42 (FIG. 3), halting the testing operation. Additionally, circuits for identifying the pin associated with the out-of-tolerance net are provided. Each of these circuits comprises a transistor and LED indicator. Transistor 201 has its base electrode coupled to the P1 terminal of shift register 88. If the testing operation is interrupted, while the net associated with P1 is under test, transistor 201 will be driven into conduction by the P1 output level, thereby causing LED 203 to become illuminated. Similarly, P2 has associated with it transistor 205 and LED 207; while P3 is coupled to transistor 209 which actuates LED 211. It should be understood that the test sequence for the pins takes place at such a very high rate, that the LED's 203, 207 and 211 will not normally be actuated. It is only when the test sequence is interrupted, that both the error LED 153 and the appropriate pin LED will be illuminated.

A similar action takes place for a 25 ohm type measurement at time T2. Only comparators 109 and 111 are effective since one input of their associated AND gate 105 is "high" as a result of the "1" state of flip-flop 91. The polarities of the input terminals of comparators 111 and 109 are reversed with respect to each other. Reference voltages −0.2 and −0.3 appearing on lines 155 and 157 are applied to the bases of transistors 159 and 161 respectively. Thus, if the potential on pin number 1 is −0.25 volts, the outputs from both comparators 109 and 111 on lines 163 and 165 respectively are both "low". The net is within tolerance. If the net produces less than −0.2 volts or more than −0.3 volts, comparators 109 and 111 will generate respectively a "high" on their output lines. If either of the comparator outputs is "high", the signal will be coupled via OR gate 107 and AND gate 105, which will then be enabled, supplying an output to OR gate 141. The resulting signal output from gate 141 will function in the same manner as that previously described to set flip-flop 149 to the "1" state and to generate an error indication.

The net associated with pin number 1 has been identified as to type at time T1 and its dc characteristics measured at time T2. The analyzer must now sequentially test the remaining pins.

Referring again to the timing generator of FIG. 3, the next clock pulse out of gate 66, advances the "1" in the second stage of shift register 31 to the third stage thereof, where it exits the register on line 167 at time T3 as seen in FIG. 5q. The output of register 31 passes via OR gate 92 (FIG. 5l) into the pin shift register 88. The "1" stored in the first stage of register 88, is advanced to the second stage. The P2 terminal, corresponding to pin number 2 under test is now "high" (FIG. 5s), while P1 is "low" (FIG. 5r). The timing shift register 31 at this instant, has "0's" in each of its three stages, and lines 33, 35 and 37, inputs to NAND gate 39 are all "low" and the gate output is "high". A square wave pulse on line 29 and the "high" on line 41 enable gate 27, and as was described hereinbefore, a "1" is entered into the first stage of register 31 at the next clock time, causing its T1 terminal to go "high". T1 and P2 are now "high", as seen respectively in FIGS. 5o and 5s, and a second complete cycle of analysis commences. This time period is represented logically in FIG. 5w. Reference to FIG. 4 will reveal those gates and analog switches enabled by the new combination of time and pin. The net associated with pin number 2 is identified at time T1, and its characteristics measured at time T2. T2 and P2 are both "high" during the latter time period, as indicated by FIG. 5x.

Assuming that no errors are discovered in the nets, the test sequence will continue, for example, T1 (FIG. 5o), P3 (FIG. 5t); T2 (FIG. 5p), P3 (FIG. 5t), the combinations represented respectively by FIGS. 5y and 5z. If more than three pins are to be tested, the pin shift register 88 must have additional stages. Also, it should be noted that the pin shift register 88 must have one stage more than the number of pins to be tested. This is necessary for the RESET function, which occurs at the completion of a test sequence.

Thus, pin register 88 in the example has four stages. When the output from timing register 31 on line 167 and applied via OR gate 92 to pin register 88, advances the "1" in the third stage to the fourth stage, an output signal from this last stage appears on line 169. This output signal is applied via OR gate 171 and line 173 to the binary counter flip-flops 46, 48 and 50 resetting them. Also reset are flip-flops 21 and 28.

The signal on line 173 sets flip-flop 175 to the "1" state, which in turn causes transistor 177 to conduct, and to illuminate a light 179 to indicate that all the nets tested during the sequence were "good". The switching of flip-flop 28 to the "0" state, causes a "high" level to be applied via line 30 to oscillator 36, turning off the square wave pulse generation. The signal on line 30 is also applied to both registers 31 and 88 via line 181 and resets them to the "0" state in preparation for the next sequence.

In addition to the automatic resetting of the analyzer flip-flop and registers at the conclusion of a test sequence, a manual resetting is also required. This procedure is normally followed after an error interruption and always prior to the start of a test sequence. Manual resetting is accomplished by actuating a push button RESET SWITCH 183. This has the effect of pulsing line 185 coupled to OR gate 171, the output of which is a reset pulse on line 173. The switching of flip-flop 149 back to the "0" state, turns off transistor 151, thereby extinguishing the "error" LED 153. Additionally, if a test sequence results in a "good" indication, that is flip-flop 175 in the "1" state, transistor 177 conducting, and "good" LED 179 on, the latter must be turned off prior to commencement of the next sequence. Actuation of the reset button 183, causes a pulse to be applied via line 187 to switch flip-flop 175 to the "0" state, to turn off transistor 177 and to extinguish LED 179.

In conclusion, the net analyzer taught by the present invention has proved highly reliable in an actual operative embodiment. It should be understood that changes and modifications of the circuit organization presented herein may be needed to suit particular requirements. Such changes and modifications are well within the skill of the electronics circuit designer, and insofar as they are not departures from the true scope and spirit of the invention, are intended to be covered by the following claims.

What is claimed is:

1. A net analyzer for testing a plurality of circuit nets which include at least two types distinguishable from each other by their controlled impedances comprising:

circuit means coupling said analyzer to the nets to be tested, current source means coupled to the net under test for causing a first current of predetermined amplitude to flow therethrough and to develop a first voltage thereacross, net type selection means including comparison means for comparing said first voltage to a reference potential and to generate an output signal which is indicative of the type of net under test, current source means coupled to said net under test for causing a second current of predetermined amplitude to flow therethrough and to develop a second voltage thereacross, net measurement means including a plurality of pairs of comparison means, each pair being associated with one of said net types, a pair of reference voltages coupled respectively to one of two input terminals of each of said pair of comparison means, said reference voltages for each of said pairs establishing a tolerance range for said second voltage, circuit means for coupling said second voltage in common to the other input terminals of all of said comparison means, gating means coupled to the outputs of each pair of said comparison means, means responsive to said net type selection means output signal for tending to enable only that particular gating means coupled to a comparison means associated with the type of net under test, the application to said last mentioned comparison means of a second voltage lying outside said tolerance range causing it to generate an output signal capable of enabling the gating means coupled thereto, an output from said gating means signifying the presence of an out-of-tolerance net.

2. A net analyzer as defined in claim 1 wherein each of said comparison means includes a comparator having a pair of input terminals and an output terminal, an input circuit comprising a pair of transistors each having an emitter, a collector and a base electrode, means for applying one of the voltages to be compared to the base of a first of said transistors, the collector of said first transistor being connected to a reference potential, the emitter of said first transistor being coupled to a supply potential and being connected to the base electrode of the second transistor, the base and collector electrodes of said second transistor being connected in common, the emitter electrode of said second transistor being coupled to said supply potential and being connected to one of said comparator inputs.

3. A net analyzer as defined in claim 2 further characterized in that the input circuits coupled respectively to the input terminals of a comparator are all common to an integrated circuit chip, thereby insuring the compatibility of their characteristics.

4. A net analyzer as defined in claim 3 wherein said current source means for causing said first and second currents to flow through the net under test comprise a plurality of transistors, each having an emitter, a collector and a base electrode, a first of said transistors being connected as an emitter follower, the second and third transistors being connected as a differential pair, said first transistor driving said second transistor, the pin associated with the net under test being included in the collector circuit of said second transistor, said collector circuit being connected to a reference potential, the collector and base of said third transistor being connected respectively to reference potentials, the emitters of said second and third transistors being connected in common, a fourth transistor connected as a constant current source and having its collector connected to said common emitters, the base of said fourth transistor being connected to a reference potential, fifth and sixth transistors having their base electrodes coupled respectively to the first and second stage output terminals of said timing shift register, the emitters of said fifth and sixth transistor being connected to a supply potential, respective different impedance means coupling the collectors of said fifth and sixth transistors to the emitter of said fourth transistor, the conduction of said fifth and sixth transistors in response to the output signal levels on said timing shift register terminals providing respectively said first and second currents.

5. A net analyzer as defined in claim 1 further including timing generator means for enabling the sequential testing of said plurality of nets each of which is coupled to a designated pin, said timing generator means including:
   oscillator means for generating upon command a train of pulses,
   binary counter means coupled to said oscillator means,
   decoder means coupled to said counter means for generating a series of clock pulses,
   a timing shift register having three stages and a pin shift register having a plurality of stages including one more stage than the number of nets to be tested, the third stage of said timing shift register being coupled to said pin shift register,
   means coupled to both said shift registers for reading information into the respective first stages thereof at a clock time,
   each of said shift register stages having a terminal associated therewith, the presence of information in a given stage causing an output signal on its terminal,
   said clock pulses being applied to said timing shift register and causing the information stored therein to be transferred from one stage to the next, the signal on the terminal of said third stage being applied to said pin shift register to advance the information stored therein from one stage to the next,
   a plurality of switching networks interposed between said shift register terminals and said plurality of nets to be tested, the output signals from the stages in said pin shift register being effective in designating each net in sequence for testing, while the output signals from the first and second stages of said timing shift register establish in turn the times for net type selection and measurement of the net designated by the pin shift register.

6. A net analyzer as defined in claim 5 further characterized in that said timing generator means includes an input circuit which comprises,
   a momentary contact start switch, a first flip-flop, a single-shot, a two-input logical AND gate and a second flip-flop,
   the "1" and "0" input terminals of said first flip-flop being coupled to said switch, such that said first flip-flop is placed in the "1" state upon actuation of said switch,
   means coupling the "1" output terminal of said first flip-flop to the input terminal of said single-shot, the switching of said first flip-flop to the one state triggering said single-shot to generate an output pulse, said output pulse being applied to one input of said AND gate, the other input of said AND gate being coupled to the "0" output side of said second flip-flop, said "0" output side also being coupled to said oscillator, the pulse output of said single-shot causing said second flip-flop to be switched to the "1" state, causing the "0" output of said second flip-flop to go "low" and turning on said oscillator, said AND gate being disabled by the "low" signal level on said flip-flop "0" output terminal, thereby blocking subsequent spurious signals from the analyzer circuits.

7. A net analyzer as defined in claim 6 wherein said binary counter is comprised of first, second and third JK type flip-flops and a two-input logical AND gate, the output signal levels from the "1" side of said first and second flip-flops being applied respectively to the inputs of said gate, the output of said gate being applied to the input of said third flip-flop.

8. A net analyzer as defined in claim 7 further characterized in that said decoder means comprises a three-input logical AND gate, the output from the "0" side of said first JK-type flip-flop and the outputs from the respective "1" sides of said second and third JK-type flip-flops being applied to the inputs of said gate, said gate generating an output clock pulse each time all three of said inputs are "high".

9. A net analyzer as defined in claim 8 further including STROBE means comprising a decoder gate, the latter being of the three input logical AND variety, the output signal from the "1" side of said first JK-type flip-flop and the output signals from the respective "0" sides of said second and third JK-type flip-flops being applied to the inputs of said decoder gate, said decoder gate generating an output signal each time all three of said inputs are "high",
   a two-input AND gate and a flip-flop, said flip-flop being switched to the "1" state in response to an oscillator pulse applied thereto, the output of said decoder gate being applied to one input of said two-input AND gate, and the "1" signal level of said flip-flop being applied to the other input thereof, the output of said last mentioned gate providing STROBE pulses for the net analyzer system.

10. A net analyzer as defined in claim 9 further characterized in that said switching networks include a two-input logical AND gate, in which one of the inputs thereof is coupled to an output terminal of said timing shift register first and second stages and the other input to one of the output terminals of the pin shift register stages associated with the nets to be tested, an electronic switch having an actuating input terminal coupled to the output of said AND gate and a pair of other terminals connected respectively to the pin under test and the appropriate comparison means.

11. A net analyzer as defined in claim 10 wherein said means responsive to said net type selection means output signal comprises a pair of two-input logical AND gates, a flip-flop, and a third two-input AND gate,
   said net type selection means output signal being applied to an input terminal of one of said pair of gates, a logical inverter coupling the last mentioned input terminal to an input terminal on the other of said pair of gates, the respective output terminals of said pair of gates being applied respectively to the "1" and "0" input terminals of said flip-flop, the third AND gate having one of its inputs coupled to the output terminal of the first stage of said timing shift register and its other input coupled to a source of STROBE pulses, the output of said third AND gate enabling one of said pair of gates, thereby causing said flip-flop to be switched to one or the other of its stable states, the signal output of said flip-flop enabling only that particular gating means associated with the comparison means applicable to the type of net being tested.

12. A net analyzer as defined in claim 11 further characterized in that the output signal from the terminal associated with the last stage of said pin shift register is coupled both to said binary counter means to reset the counter and to said oscillator for terminating its output.

13. A net analyzer as defined in claim 12 further including a flip-flop and a "good" indicator circuit including a transistor current source and a LED located within its current path, said transistor being coupled to the "1" output terminal of said flip-flop, said flip-flop being normally in the "0" state, said reset signal from the terminal associated with the last stage of said pin shift register being applied to the "1" input side of said flip-flop, the switching of said flip-flop to the "1" state causing the conduction of said transistor and current flow through its associated LED, thereby indicating that in the test sequence just completed, all nets were "good".

14. A net analyzer as defined in claim 13 further characterized in that the output of said gating means indicative of an out-of-tolerance net is applied to an "error" indicating circuit, said indicating circuit comprising a flip-flop, a transistor current source and a LED located within its current path, said transistor being coupled to the "1" output terminal of said flip-flop, said flip-flop being normally in the "0" state, said output from said gating means being applied to the "1" input side of said flip-flop and switching said flip-flop to the "1" state, causing the conduction of said transistor and current flow through its associated LED, thereby indicating that the net under test contains an "error", a gate interposed between said oscillator and the "0" output side of said flip-flop, the switching of said flip-flop to the "1" state causing said gate to be disabled and halting the application of oscillator pulses to said binary counter in order to interrupt the analyzer test sequence.

15. A net analyzer as defined in claim 14 further characterized in that an error lamp indicator circuit is coupled to each of the output terminals of the pin shift register associated respectively with the pins to be tested,
each of said indicator circuits comprising a transistor having an emitter, a collector and a base electrode, means coupling the base electrode to one of said pin shift register output terminals, the emitter electrode being coupled to a source of supply potential, a light emitting diode having a pair of electrodes, one of its electrodes being connected to the collector of said transistor and its other electrode being coupled to a source of reference potential.

16. A net analyzer as defined in claim 15 further including manual momentary contact reset switch means coupled to the "0" input side of said "error" indicating circuit flip-flop, the actuation of said switch causing said flip-flop to assume a "0" state said switch means being also coupled by OR gating means to the same reset path as that travelled by the output signal from the terminal associated with the last stage of said pin shift register at the termination of a test sequence, whereby the actuation of said switch causes a reset signal to traverse said path.

* * * * *